United States Patent
Gonzalez-Martin et al.

[11] Patent Number: 5,974,681
[45] Date of Patent: Nov. 2, 1999

[54] APPARATUS FOR SPIN DRYING A WORKPIECE

[75] Inventors: Jose R. Gonzalez-Martin, Phoenix; Arthur Hamer, Sun Lakes, both of Ariz.

[73] Assignee: SpeedFam-IPEC Corp., Chandler, Ariz.

[21] Appl. No.: 08/927,661

[22] Filed: Sep. 10, 1997

[51] Int. Cl.[6] .................................................. F26B 17/24
[52] U.S. Cl. .................................................. 34/58
[58] Field of Search .................................. 34/312, 58, 60, 34/61, 84, 108; 134/902, 25.4, 30, 140

[56] References Cited

U.S. PATENT DOCUMENTS

| | | | |
|---|---|---|---|
| 4,651,440 | 3/1987 | Karl | 34/58 |
| 4,700,595 | 10/1987 | Soares . | |
| 4,989,345 | 2/1991 | Gill, Jr. . | |
| 5,667,535 | 9/1997 | Kasahara . | |
| 5,775,000 | 7/1998 | Maekwa et al. | 34/58 |
| 5,778,554 | 7/1998 | Jones | 34/58 |
| 5,829,156 | 11/1998 | Shibasaki et al. | 34/58 |

FOREIGN PATENT DOCUMENTS

| | | |
|---|---|---|
| 0434307 | 12/1990 | European Pat. Off. . |
| 0795892 | 3/1997 | European Pat. Off. . |
| 09017761 | 1/1997 | Japan . |

*Primary Examiner*—Henry Bennett
*Assistant Examiner*—Steve Gravini
*Attorney, Agent, or Firm*—Snell & Wilmer L.L.P.

[57] ABSTRACT

A spin dryer assembly for drying workpieces such as semiconductor wafers includes a workpiece platform for receiving a workpiece to be dried. A motor is coupled to and spins the platform to effect removal of water and particulates from the workpiece. Gripping fingers are pivotally mounted around the platform and securely grip the workpiece during drying. Spring loaded plungers maintain the gripping fingers in a secured position during drying. A cam ring is vertically movable into and out of contact with the gripping fingers to bias the gripping portions of the fingers outwardly to a release position after drying.

12 Claims, 9 Drawing Sheets

APPARATUS FOR SPIN DRYING A WORKPIECE

TECHNICAL FIELD

The present invention relates, generally, to an apparatus for spin drying semiconductor workpieces during a cleaning process and, more particularly, to an improved and balanced spin dryer including a perforated spinner plate having a gripper mechanism for holding a workpiece by its edges during a spin dry operation.

BACKGROUND ART AND TECHNICAL PROBLEMS

Semiconductor devices, such as microprocessors, memory devices, and other microelectronic computer "chips", are typically produced from a thin, flat, circular disk of material, often referred to as a silicon wafer. A large number of identical microelectronic structures are created on a single wafer and the wafer is then cut into individual devices, whereupon each device is packaged for sale as a chip.

During the manufacture of such semiconductor devices, a series of layers are typically produced on the surface of a wafer. A layer of microelectronic structures may be applied to the wafer surface through the use of, for example, optical lithography, as is well known in the art. In the production of integrated circuits, a plurality of interrelated layers of microelectronic structures are superimposed on the surface of the wafer, with a layer of a dielectric interposed between and separating each of the microelectronic layers. Proper application of a microelectronic layer requires a smooth, highly planar surface. Thus, after each layer of dielectric is applied to a workpiece, the workpiece is planarized through the use of, for example, a chemical mechanical planarization (CMP) machine.

The production of semiconductor devices requires a high degree of purity; hence, powerful and mature clean room manufacturing techniques have been developed. An integral component of clean room fabrication processes is a thorough cleaning of wafers after each planarization, polishing, or other process. A typical cleaning operation passes wafers through a series of scrub rollers, whereupon the wafers are rinsed to remove all particles from the wafer surfaces. After rinsing, the wafers must be dried prior to storage and/or transportation to subsequent processing step(s).

Presently known spin dry systems rely on centrifugal forces which result from spinning wafers at high velocities (e.g., 2,700 to 5,000 rpm) to drive water droplets radially outward from the wafer surfaces, and to thereby liberate all water from the wafer surfaces. The drying of a wafer after cleaning is typically accomplished by placing the wafer on a platform and spinning the platform at a high velocity, for example on the order of 1,000–3,000 rpm, to liberate all rinse water and any residual particles from the wafer surfaces. As a result of these high process velocities, presently known spin drying systems typically confront the following two concerns:

I) the need to protect operators and equipment from disk fragments which could be thrown from the spin dryer in the event that a disk is broken during the spin dry process; and ii) the need to prevent water thrown from disks during the drying process from contacting disks which have already been dried.

In many prior art systems, these two needs are addressed by isolating the spinner, for example through the use of a shield, compartment, or the like.

Presently known spin dry systems are unsatisfactory in several regards. As spin rates increase, for example, stresses on and in the wafers being spun also increase, resulting in enhanced risks of wafer damage. Moreover, attempts to shield spinning wafers from operators and adjacent equipment tend to increase the "footprint" of the cleaning and/or drying machine, thereby increasing the cost of capital equipment acquisition and maintenance. Such costs become particularly high in a clean room environment.

As semiconductor manufacturers are experiencing increased pressure to increase throughput in response to the growing demand for computer chips, it is also desirable to decrease the time required to dry rinsed wafers. In view of the aforementioned circumstances, however, it is problematic to simply increase the spin rate to thereby decrease drying time.

SUMMARY OF THE INVENTION

The present invention provides a method and apparatus for spin drying workpieces, such as semiconductor wafers, which overcomes many of the shortcomings associated with prior art spin dry systems.

In accordance with one aspect of the present invention, a spin dryer assembly includes a platform for securely grasping a workpiece to be dried. The platform is mounted to a drive shaft and motor configured to rotate the platform (and hence the workpiece), thereby generating sufficiently high centrifugal forces to remove water and other particulates from the workpiece surfaces. Pivotally mounted gripping fingers are provided which grip the workpiece by its outer peripheral edges.

In accordance with another aspect of the present invention, an actuator assembly is vertically movable into and out of contact with the gripping fingers. The actuator assembly includes a cam ring which contacts, and biases radially inwardly, shank portions of the gripping fingers to effect pivotal movement of head portions of the gripping fingers out of contact with the workpieces to thereby release the workpieces. When the cam ring is moved out of contact with the gripping fingers, spring loaded plungers bias the shank portions of the gripping fingers radially outwardly which, in turn, effects radially inward pivotal movement of the head portions of the gripping fingers to thereby contact and secure the workpiece on the platform.

In accordance with yet another aspect of the present invention, apertures are formed through the workpiece platform to reduce the mass of the spin dryer and thereby permit reduced acceleration and deceleration time. The apertures are preferably symmetrically arranged relative to the gripping figures to provide balance to the spin dryer assembly.

In accordance with a further aspect of the present invention, a circular shroud surrounds the spin dryer assembly to keep water liberated from workpieces in an enclosed, isolated area and to prevent workpiece fragments from being thrown from the platform in the event that a workpiece is destroyed during the drying process.

In accordance with a still further aspect of the present invention, a forced air stream is caused to flow across the upper surface of the workpiece to augment the drying process. In a particularly preferred embodiment, the column of forced air exhibits a substantially constant velocity throughout the cross-sectional area of the forced air column. In this way, a substantially laminar air flow column is applied to the workpiece, thereby preventing eddy currents or other turbulent phenomena from carrying particles and/or moisture back to the surface of the workpiece.

These and other aspects of the present invention are described in full detail in the following description, attached drawings and claims.

BRIEF DESCRIPTION OF THE DRAWING FIGURES

The present invention will be described herein in conjunction with the appended drawing figures, wherein like numerals denote like elements, and:

FIG. 5b is a side view of the workpiece platform of FIG. 5a;

FIG. 6b is a plan view of the cam ring portion of FIG. 6a;

FIG. 7b is a plan view of the base ring portion of FIG. 7a;

DETAILED DESCRIPTION OF PREFERRED EXEMPLARY EMBODIMENTS

Figure 1:
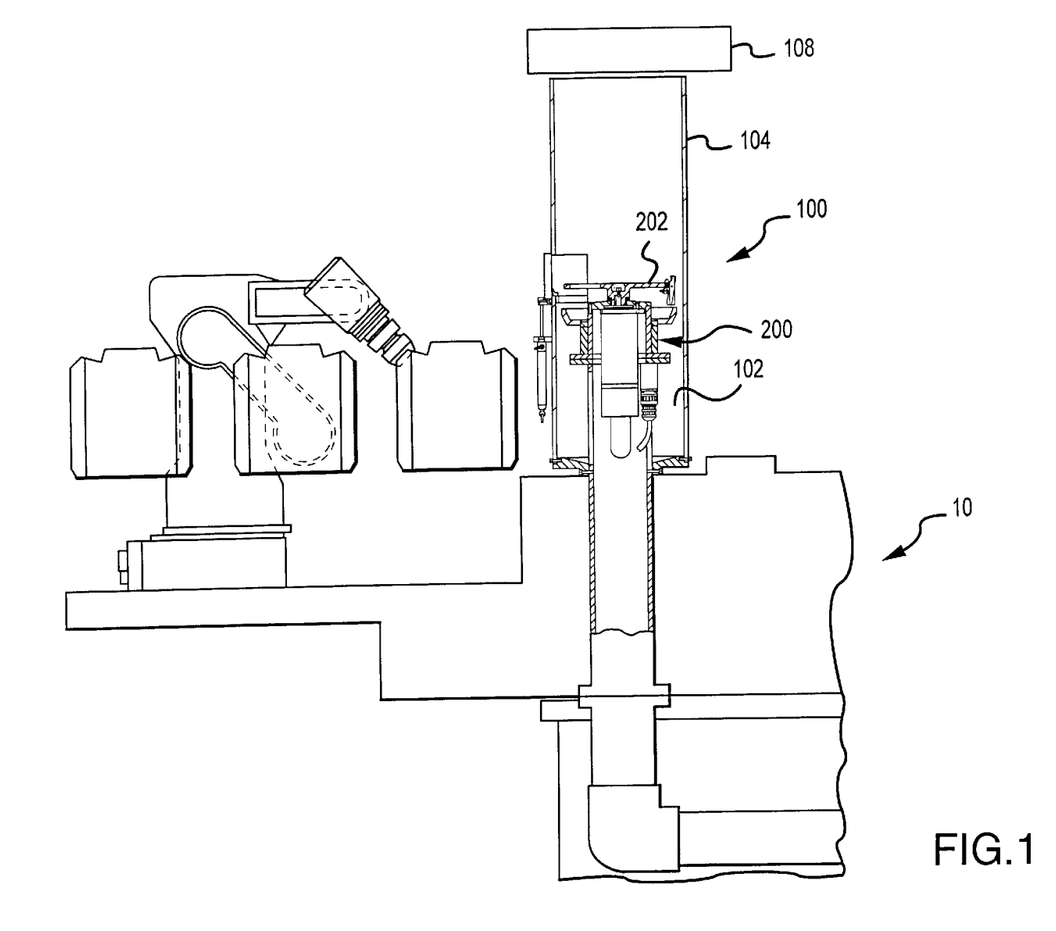
FIG. 1 is a cross-sectional view of a spin dryer assembly according to the present invention, shown as mounted on an exemplary machine for polishing, cleaning, rinsing and drying semiconductor workpieces.

A spin dryer assembly 100 according to the present invention is illustrated in FIG. 1. Spin dryer assembly 100 is shown mounted on an exemplary machine 10 for polishing, cleaning, rinsing and drying workpieces such as semiconductor wafers. Though spin dryer assembly 100 is illustrated in connection with machine 10, it could be utilized in any environment requiring efficient spin drying of workpieces.

Assembly 100 comprises a spin dryer 200 enclosed within a chamber 102 defined by pipe-like shroud or shield 104. Air flow module 108 is appropriately mounted above or within shroud 104 such that a substantially uniform velocity column of forced air is directed towards spin dryer 200, as will be discussed in greater detail below.

Figure 2A:
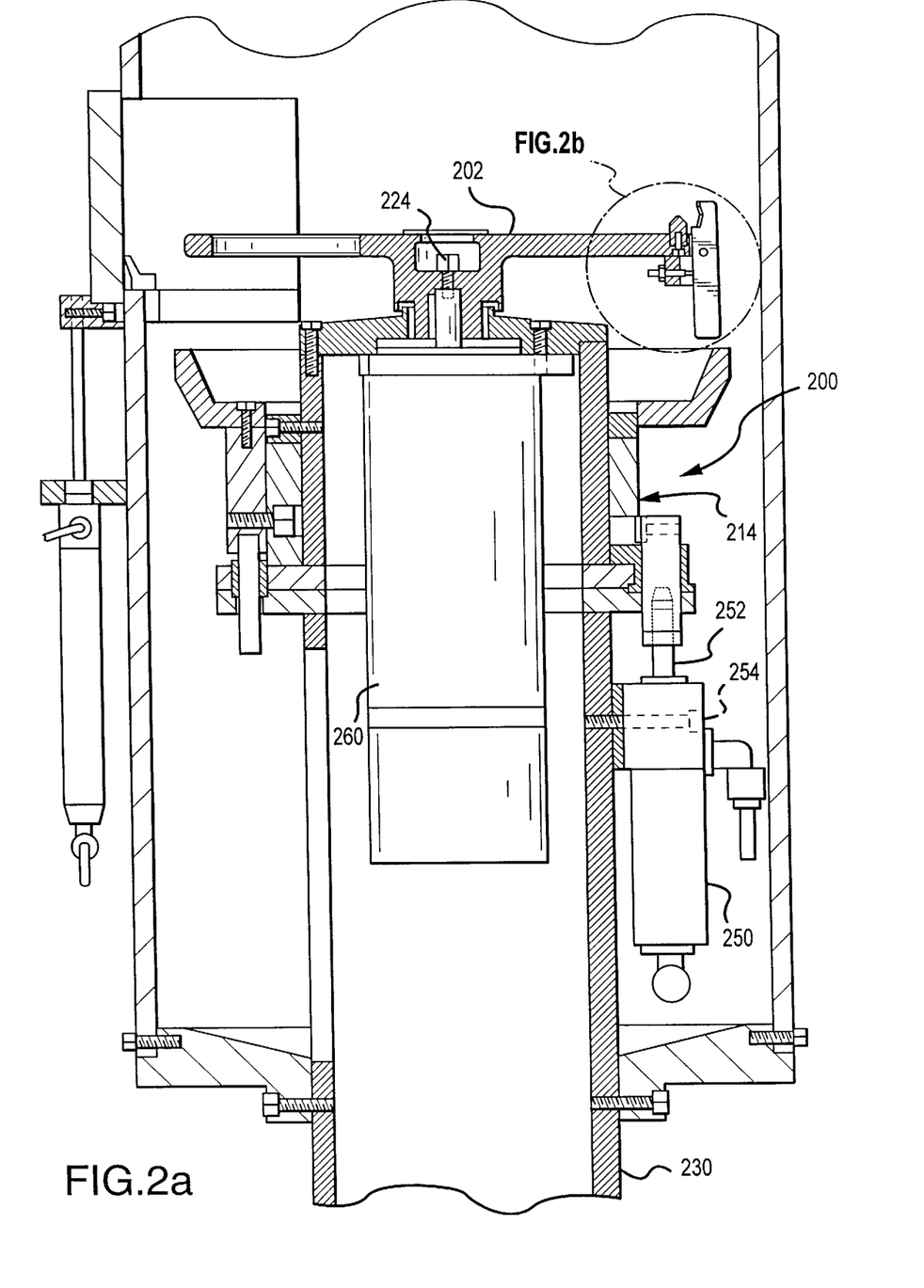
FIG. 2a is a sectional view of the spin dryer portion of the assembly of FIG. 1, depicting a gripping finger in a position for securing a workpiece during spin drying.
Figure 2B:
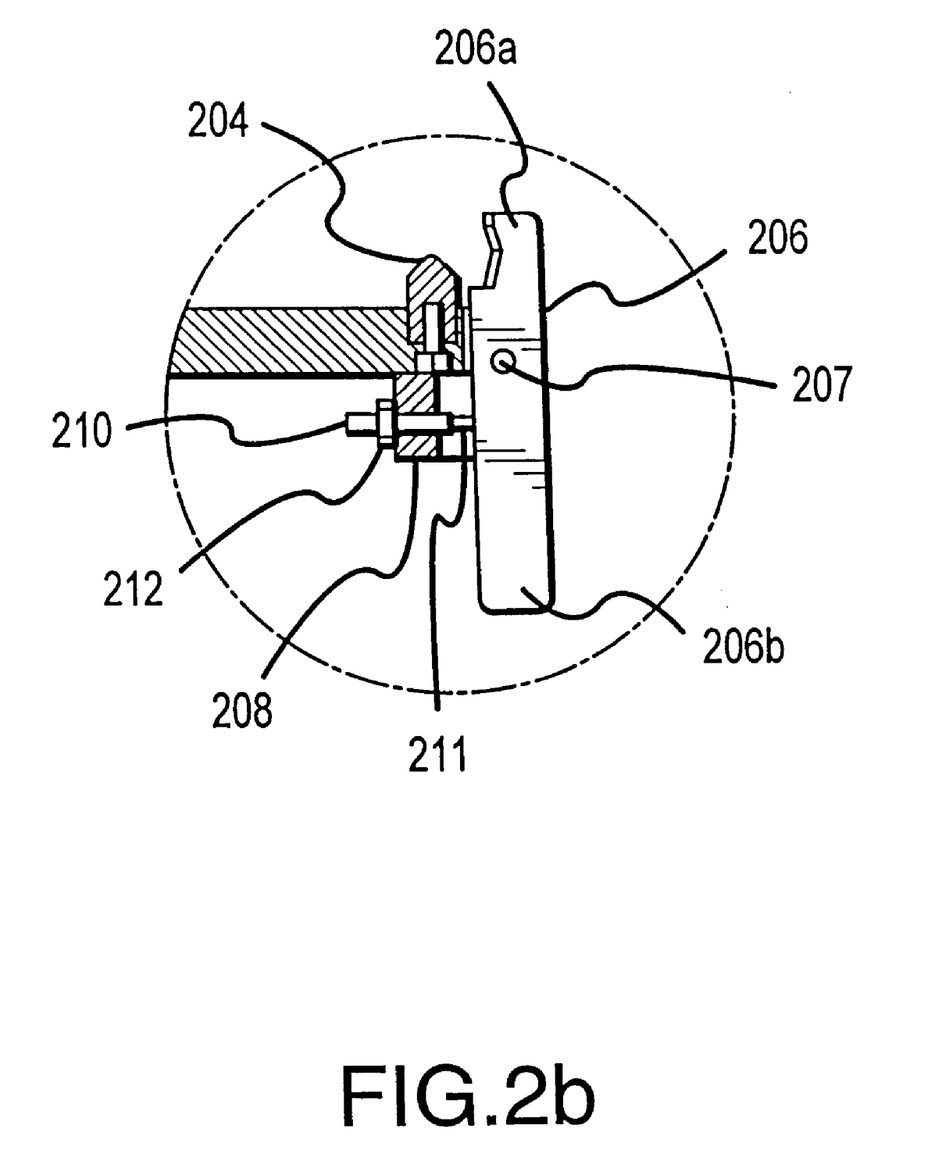
FIG. 2b is an exploded sectional view of a gripping finger, spring loaded plunger and support pin attached to a workpiece platform in accordance with the present invention.

Referring now to FIG. 2, spin dryer 200 comprises a workpiece platform 202 which is configured to securely hold thereon a workpiece, such as a semiconductor wafer, as the workpiece is spun at a high velocity. Although the present invention is envisioned and intended for use in conjunction with virtually any type of circular workpiece amenable to being grasped by the edges and spin dried, for sake of brevity, the remainder of this specification will discuss spin dryer 200 in the context of semiconductor wafers.

Figure 3:
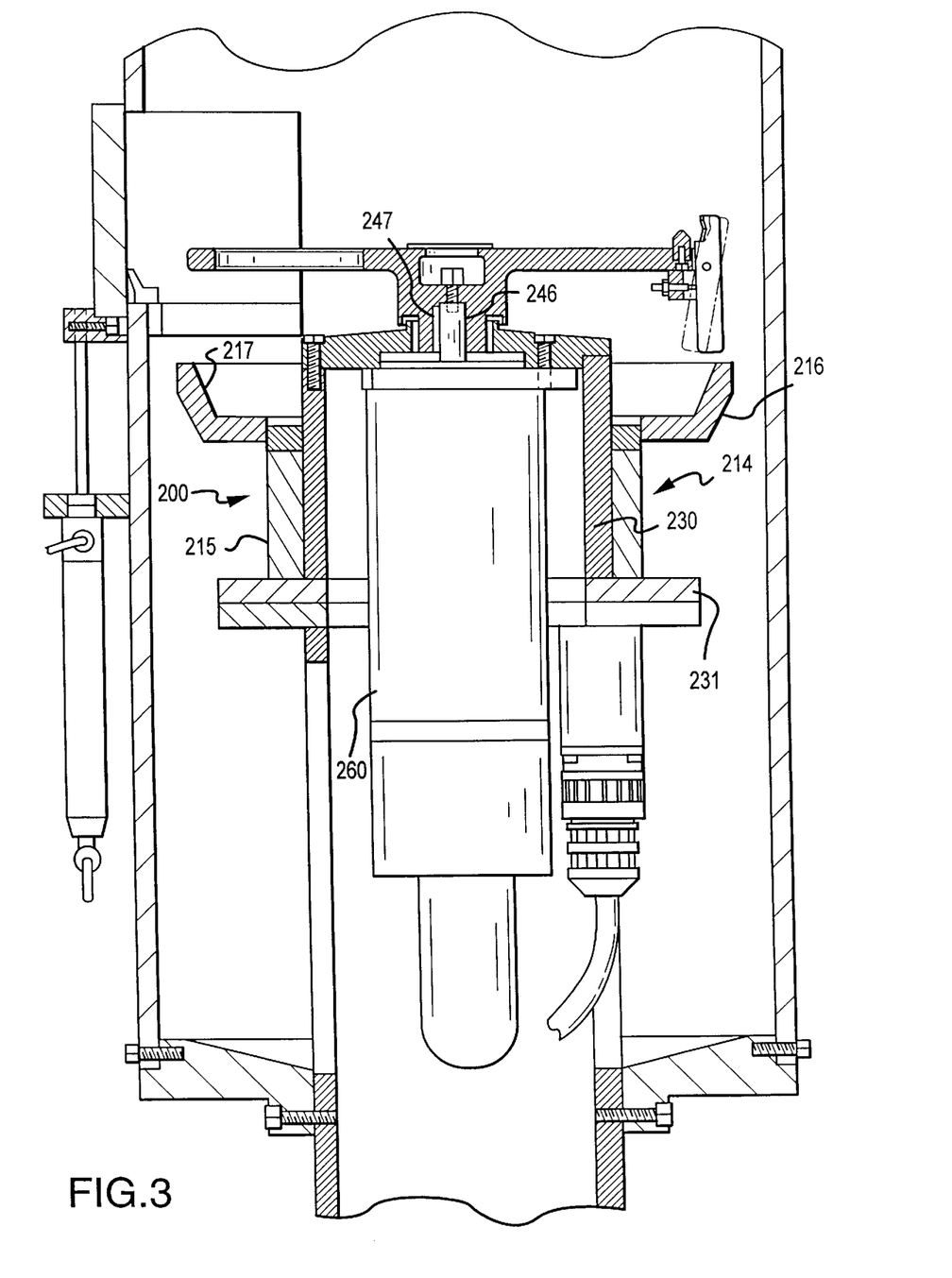
FIG. 3 is a sectional view of the spin dryer portion of the assembly of FIG. 1, depicting in phantom lines a gripping finger in a position for releasing a workpiece.

Centrifugal forces applied to a wafer held on platform 202 as the platform is spun at high velocities draws water droplets radially outwardly and off of the wafer surfaces. Platform 202 is rotated at high velocities by virtue of its connection to a motor 260. Motor 260 is contained within housing 230 and includes a drive shaft 246 having a key 247 (FIG. 3). Shaft 246 extends from motor 260, through an opening in the top of housing 230, and is secured within a mating receptacle 232 formed in the bottom of platform 202 by a screw 224 or other appropriate fastener. Key 247 formed on shaft 246 mates with keyway 248 formed in platform receptacle 232 (best seen in FIGS. 5a and 5b) to thereby fix shaft 246 and platform 202 for relative rotation. A motor suitable for use with the present invention is manufactured under Model No. ASM81C by the Berkeley Process Controls company of California.

In order to minimize the amount of time required to spin dry wafers, rapid acceleration and deceleration of platform 202 is desirable. Spin dryer 200 is preferably configured to accelerate from an idle condition to maximum spin dry speed, that is, from 0 to approximately 4,000 rpm, in the range of 0.5 to 4.0 seconds, and most preferably in about 1.0 seconds. Spin dryer 200 is further configured to sustain a maximum spin dry speed in the range of 3,000–5,000 rpm (most preferably 3,600–4,400 rpm, and optimally about 4,000 rpm) for a period of 10–30 seconds, and most preferably for about 20 seconds. Finally, spin dryer 200 is configured to decelerate back to an idle condition in the range of 0.5 to 4.0 seconds, and most preferably in about 1.0 seconds. Minimization of the mass of spin dryer 200 is key to achieving these performance parameters.

Figure 4:
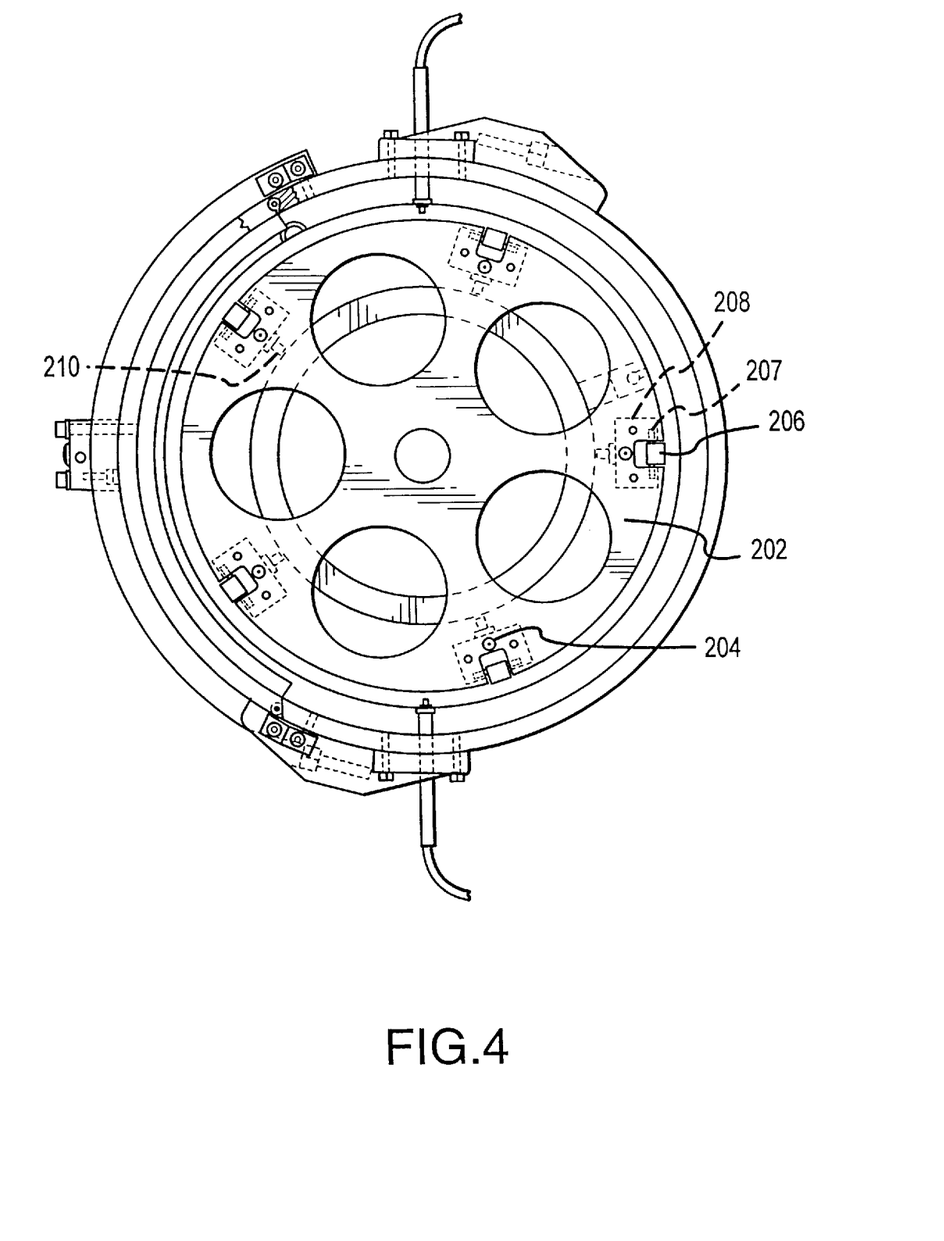
FIG. 4 is a plan view of the spin dryer assembly of FIG. 1.
Figure 5A:
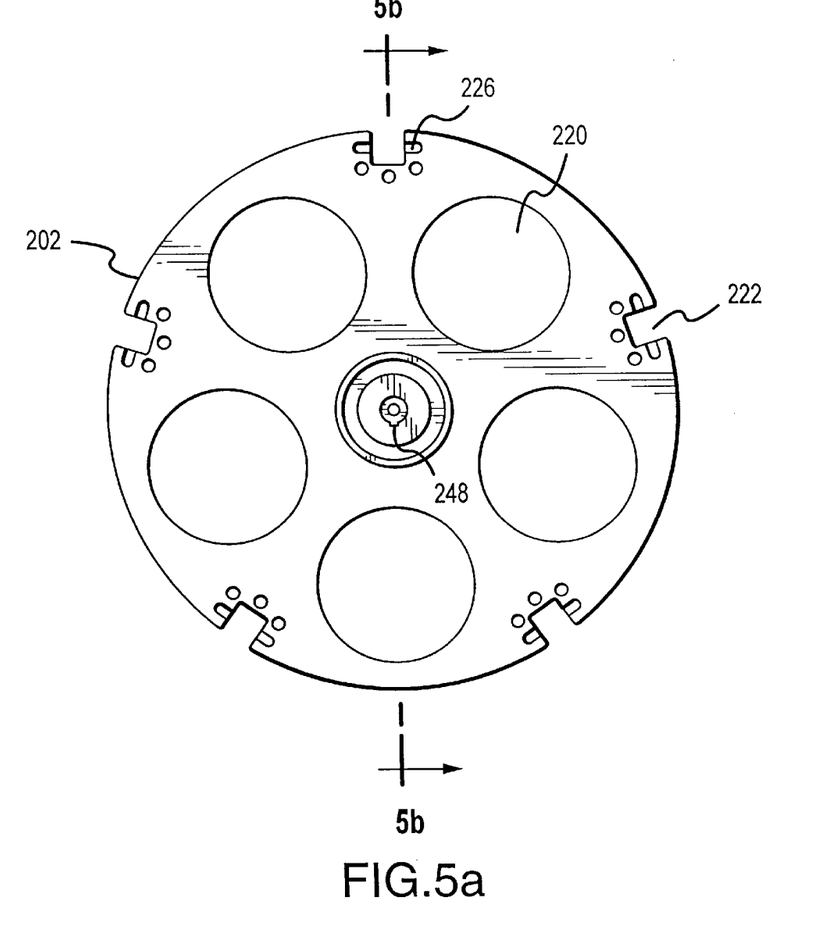
FIG. 5a is a plan view of a workpiece platform according to the present invention.
Figure 5B:
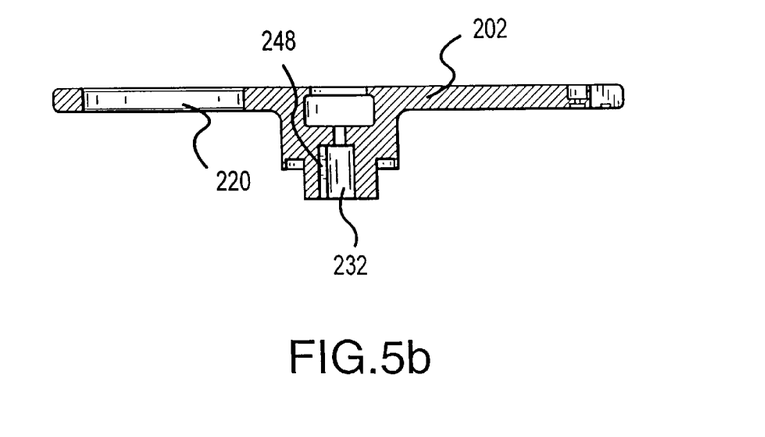
Figure 6A:
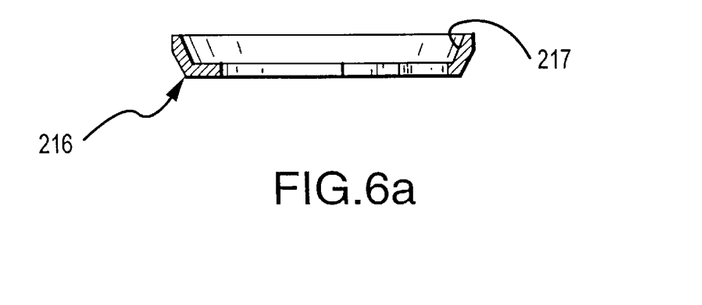
FIG. 6a is a sectional side view of the cam ring portion of an actuator assembly according to the present invention.
Figure 6B:
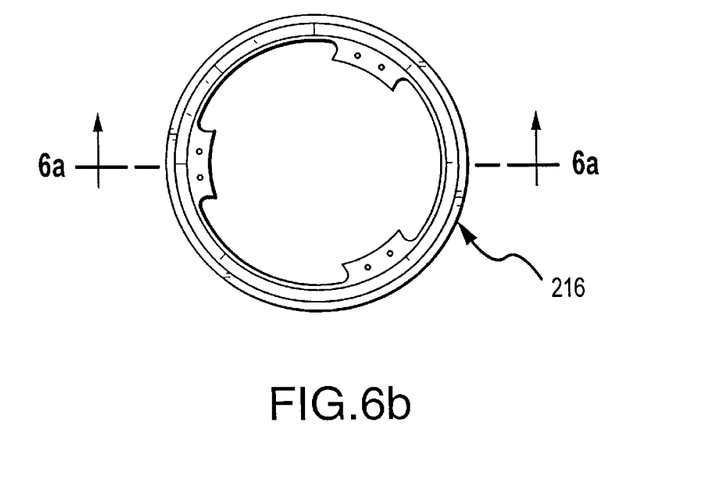
Figure 7A:
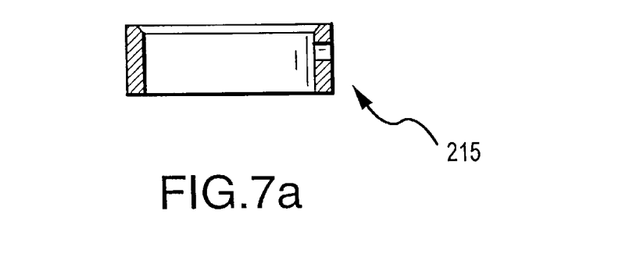
FIG. 7a is a sectional side view of the base ring portion of an actuator assembly according to the present invention.
Figure 7B:
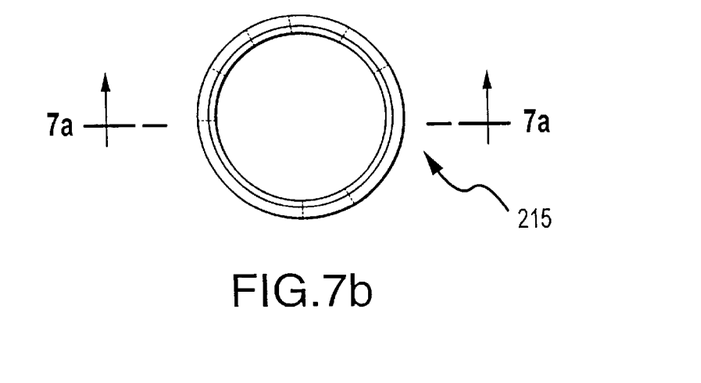
Figure 8:
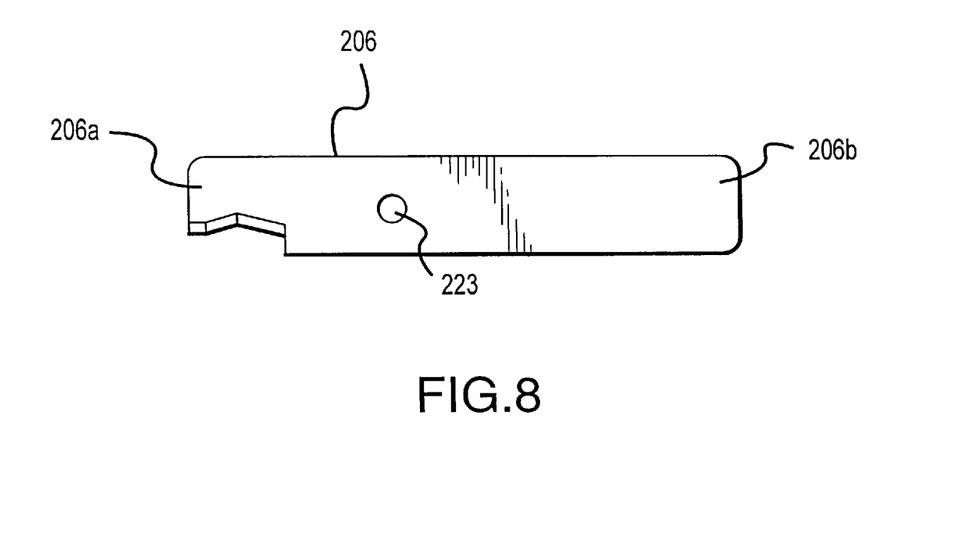
FIG. 8 is an exploded side view of a gripping finger according to the present invention.

In furtherance of minimizing the mass of spin dryer 200, a plurality of mass-reducing apertures or perforations 220 are formed through platform 202. Apertures 220 are best illustrated in FIGS. 4, 5a and 5b. The placement, size and number of apertures 220 are calculated to maximize the reduction in mass of platform 202 while ensuring sufficient structural integrity of the system. In the illustrated embodiment, five apertures 220 are equidistantly spaced around, and formed through, the outer circumferential portion of platform 202. Platform 202 may be constructed from any strong, lightweight material. 6061-T6 aluminum is an example of one such material.

Actuator assembly 214 is mounted around housing 230 below platform 202. Assembly 214 comprises a base ring 215 and a cam ring 216. Base ring 215 rests above shoulder 231 formed in housing 230 and is vertically movable relative to housing 230. Cam ring 216 is fixed above base ring 215 and is formed with an inclined cam surface 217. Actuator assembly 214 is operated by an air cylinder 250 which is attached to housing 230 below assembly 214 through use of a bolt 254 or another appropriate fastener. A vertically movable connective member 252 operatively links air cylinder 250 and actuator assembly 214. Actuation of air cylinder 250 causes upward vertical movement of connective member 252 which, in turn, causes upward vertical movement of assembly 214. After sufficient vertical movement actuator assembly 214 engages gripping fingers 206 attached to platform 202 to effect the controlled release of a wafer from the platform, as will be described in more detail below.

A plurality of gripping fingers 206 are pivotally mounted in notches 222 (see FIG. 5a) formed around the outer periphery of platform 202. The pivotal mount is accomplished through use of a pin 207 which extends through a bore 223 formed through fingers 206 and into pin receptacles 226 formed in platform 202. Each gripping finger 206 includes a head portion 206a extending above platform 202 and a shank portion 206b extending below platform 202.

Though any appropriate number of gripping fingers may be employed, preferably five gripping fingers 206 are mounted in notches 222 equidistantly spaced around the periphery of platform 202 in central locations relative to the five apertures 220. This symmetrical arrangement of fingers 206 relative to apertures 220 provides balance to spin dryer 200. Fingers 206 are preferably made from a soft, pliable material which will not scratch, damage, or otherwise adversely affect wafers which they contact and grip. An example of a suitable material is Ertalyte.

Spring plungers 210 are mounted within mounting blocks 208 attached below platform 202 (see FIG. 2b) at locations adjacent and spaced radially inwardly from notches 222. Plungers 210 are secured within mounting blocks 208 by lock nuts 212 or any other suitable fasteners. Each plunger 210 is spring loaded and includes a head 211 that is biased radially outwardly and contacts the shank 206b of the adjacent gripping finger 206. Shanks 206b are thereby urged radially outwardly. By virtue of the pivotal attachment of fingers 206 to platform 202, outward radial movement of shanks 206b effects inward radial movement of heads 206a. In this manner, fingers 206 grip or grasp the outer perimeter of a wafer resting on platform 202 to secure the wafer during operation of spin dryer 200.

Shank portions 206b of fingers 206 extend a sufficient distance below pivot pin 207 to provide a counterweight effect. Centrifugal forces imparted to fingers 206 during operation of spin dryer 200 will cause shank portions 206b to move radially outwardly and hence, head portions 206a to pivot radially inwardly. This is advantageous in that the gripping effect of fingers 206 is enhanced. Moreover, should spring-loaded plungers 210 fail to function properly, a gripping effect will still be provided by virtue of the centrifugal forces acting on fingers 206.

A plurality (e.g., five) of support pins 204 are disposed about the outer perimeter of platform 202 in alignment with gripping fingers 206. Wafers do not rest directly on platform 202 but instead rest on top of support pins 204. Support pins 204 are also preferably made from a soft, pliable material, such as Ertalyte, that will not scratch or otherwise damage the wafers being processed.

Operation of spin dryer assembly 100 is as followed. When a wafer is ready for loading onto platform 202, air cylinder 250 is actuated to urge assembly 214 upwardly and into contact with the shank portions 206b of gripping fingers 206. Cam surface 217 contacts shank portions 206b and, as assembly 214 continues to move upwardly, causes the shank portions to pivot radially inwardly (FIG. 3). Consequently, head portions 206a pivot radially outwardly and provide clearance for loading a wafer onto platform 202.

Next, a robot arm or other appropriate mechanism loads a wafer onto platform 202. The wafer does not directly contact platform 202, but instead, rests on pliable support pins mounted above platform 202. Once the wafer is properly placed, actuator assembly 214 begins to move downwardly and away from gripping fingers 206. As shank portions 206b slide along cam surface 217, spring loaded plungers 210 bias the shank portions radially outwardly. Consequently, head portions 206a pivot radially inwardly and engage and grip the wafer resting on platform 202 to secure the wafer during the spin dry process.

Once the wafer has been properly secured as described above, motor 260 effects high velocity rotation of platform 202, and hence, the wafer secured thereon. Any residual water rinse water present on the wafer surfaces is removed from the wafer by the centrifugal forces acting on the wafer. Shroud 104 surrounding spin dryer 200 keeps the water liberated from the spinning wafer in an enclosed, isolated area and also prevents wafer fragments from being thrown from the platform in the event that a wafer is damaged or destroyed during the spin drying process.

An air flow module 108 may be mounted above shroud 104 to generate a forced air stream during spin drying. Application of a column of forced air across the upper wafer surface augments the drying process. Preferably, a clean room-type air supply is employed and generates an air stream which is of substantially constant velocity throughout the cross-section of the discharged air such that a substantially uniform column of air is applied to the top surface of the wafer. In this way, a substantially laminar air flow column is applied to the wafer, thereby preventing eddy currents or other turbulent phenomena from carrying particles and/or moisture back to the surface of the workpiece. Alternatively, an air flow mechanism could be disposed inside shroud 104 by, for example, incorporating an impeller mechanism onto platform 202.

Shroud 104 may be configured to exhaust the forced air stream from the underside of platform 202, such that a substantially uniform flow of air impinges upon the upper surface of the workpiece and is thereafter drawn downwardly through the annulus defined between the outer perimeter of platform 202 and the inner diameter of shroud 104. The inner diameter of shroud 104 may be selected to ensure optimum clearance in the region between it and the outer perimeter of platform 202 and that, for a given average flow velocity, substantially laminar or uniform airflow is obtained at the plane of the workpiece.

Once the spin drying cycle is complete, actuator assembly 214 is again urged upwardly to engage shank portions 206b and cause gripping fingers 206 to move to a release position as described above. Assembly 214 is maintained in this position and head portions 206a of gripping fingers 206 are maintained in an outwardly biased position until the dried wafer has been removed for further processing and another wafer is loaded for spin drying. The process then repeats as described above.

Figure 9:
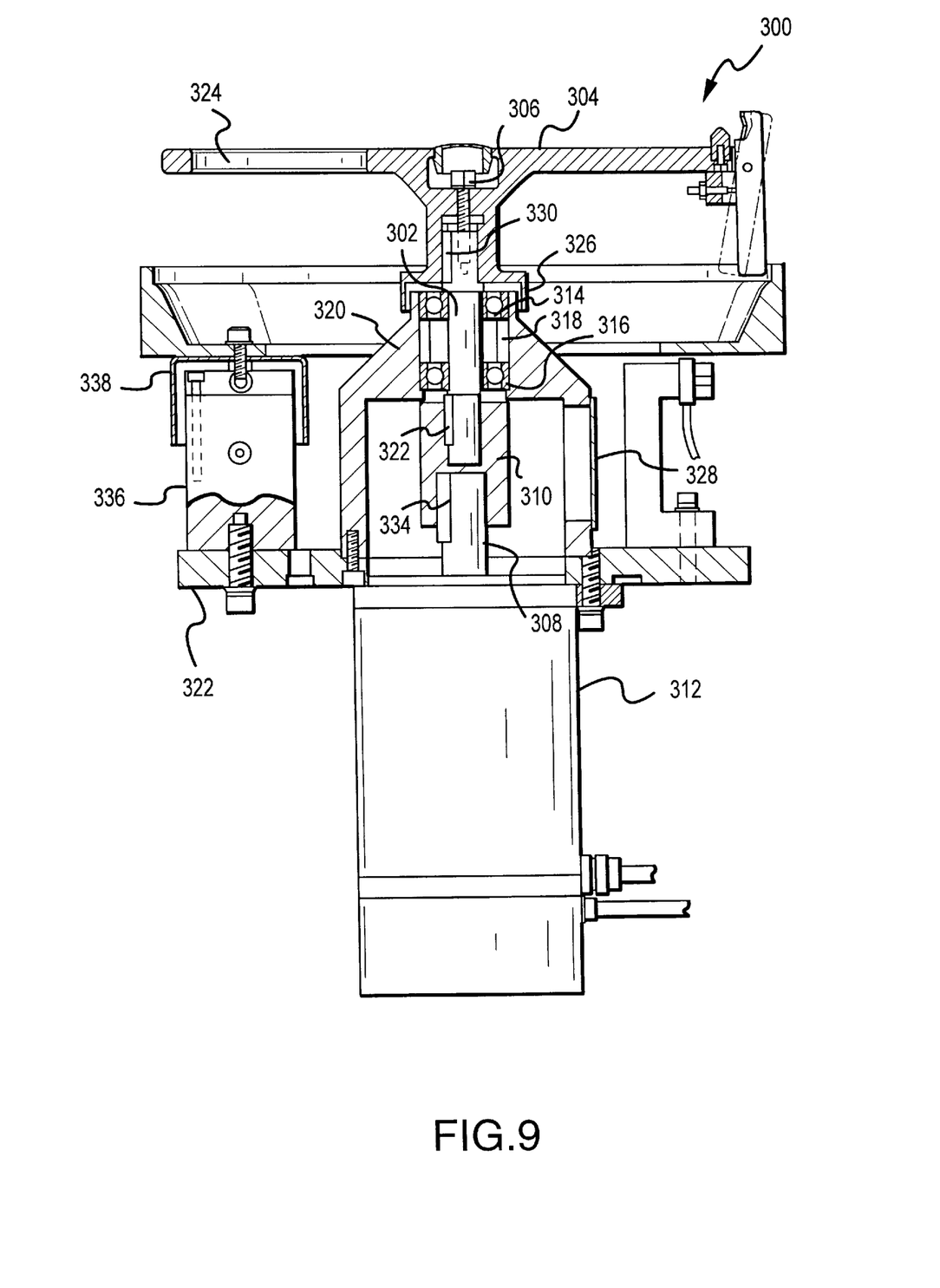
FIG. 9 is a sectional view of an alternate embodiment of a spin dryer assembly according to the present invention.

An alternate spin dryer embodiment 300 is shown in FIG. 9. Spin dryer 300 operates in essentially the same fashion as spin dryer 200, but rather than utilizing a direct connection between the workpiece platform and motor drive shaft, an intermediate bearing shaft 302 is disposed therebetween. Only those features which differ substantially from the previously described spin dryer embodiment will be described in detail.

Workpiece platform 304 is secured to bearing shaft 302 through use of a screw 306 or other suitable fastening mechanism. Bearing shaft 302 is coupled to motor drive shaft 308 by flexible coupler 310. Drive shaft 308, in turn, is directly attached to motor 312. Key and keyway combinations 330, 332 and 334 effect fixed relative rotation of platform 304, bearing shaft 302 and drive shaft 308. Respective drive bearings 314 and 316, shown separated by a bearing spacer 318, are suitably housed within bearing housing 320. Bearing housing 320, is rigidly affixed to mounting plate 322 which, in turn, is rigidly secured to the frame of the spin dryer assembly.

The spin dryer embodiment illustrated in FIG. 9 is useful in applications where the drive motor utilized does not have sufficient capacity for absorbing the high acceleration and deceleration loads created by the spin dry process. The acceleration and deceleration loads are carried primarily by drive bearings 314 and 316 rather than by the bearings (not shown) internal to motor 312. Hence, the moment of inertia that must be borne by the motor bearings is reduced and acceleration and deceleration times are optimized. Formation of platform 304 with mass-reducing apertures 324, as described with reference to spin dryer 200, further contributes to reduction in acceleration and deceleration times.

Workpiece platform 304 is formed with a downwardly opening collar 326 which functions as a protective cover to protect bearings 314 and 316 from leakage of water into the interior of bearing housing 320. It may also be necessary to provide air cylinder 336 with a protective cap 338 to guard against water infiltration. Bearing housing 320 also preferably includes a removable access panel or door 328 to allow manual access to coupling 310 and the drive shafts associated therewith.

The present invention has been described with reference to particular embodiments described in the text and attached drawing figures. It should be appreciated, however, that the scope of the invention is not so limited. Modification may be made to the particular embodiments described herein without departing from the spirit and scope of the invention as represented in the following claims.

We claim:

1. A spin dryer assembly comprising:
    a workpiece platform for receiving a workpiece to be dried;
    a plurality of gripping means attached to said platform for securely gripping said workpiece;
    a motor attached to said platform, said motor effecting high speed rotation of said platform and removal of fluid and particulates from said workpiece; and
    a vertically movable actuator assembly which engages each of said gripping means for effecting release of said workpiece from said platform after said workpiece has been dried.

2. An assembly as claimed in claim 1, wherein said gripping means comprises a plurality of gripping fingers pivotally mounted around the outside periphery of said platform.

3. An assembly as claimed in claim 2, wherein said gripping fingers include head portions extending above said platform and shank portions extending below said platform.

4. An assembly as claimed in claim 3, wherein there are five gripping fingers equidistantly spaced around said platform.

5. An assembly as claimed in claim 3, and further comprising spring loaded plungers mounted below said platform, said plungers engaging said shank portions and biasing said shank portions radially outwardly and said head portions radially inwardly to grip said workpiece.

6. An assembly as claimed in claim 5, wherein said actuator assembly engages said shank portions and biases said shank portions radially inwardly and said head portions radially outwardly to effect release of said workpiece.

7. An assembly as claimed in claim 6, wherein said actuator assembly comprises a cam ring which engages said shank portions of said gripping fingers.

8. An assembly as claimed in claim 1, and further comprising mass-reducing apertures formed through said platform.

9. An assembly as claimed in claim 4, and further comprising five mass-reducing apertures formed through an outer circumferential portion of said platform, said apertures being equidistantly spaced and symmetrically arranged relative to said gripping fingers to provide balance to said assembly.

10. An assembly as claimed in claim 1, wherein support pins formed from a soft, pliable material are attached above said platform to prevent direct contact between said workpiece and said platform.

11. An assembly as claimed in claim 1, and further comprising a protective shroud surrounding said platform to isolate water and particulates removed from said workpiece.

12. An assembly as claimed in claim 11, and further comprising an air flow module mounted above said shroud which generates a column of forced air across an upper surface of said workpiece to augment drying of said workpiece.

* * * * *

UNITED STATES PATENT AND TRADEMARK OFFICE
CERTIFICATE OF CORRECTION

PATENT NO. : 5,974,681
DATED : November 2, 1999
INVENTOR(S) : Gonzalez-Martin, et al.

It is certified that error appears in the above-identified patent and that said Letters Patent is hereby corrected as shown below:

Title page, item [75] please add after Sun Lakes, --Anand Gupta, Phoenix,--
please change "both" to --all--

Signed and Sealed this

Sixth Day of June, 2000

Attest:

Attesting Officer

Q. TODD DICKINSON

*Director of Patents and Trademarks*